(12) United States Patent  
Di Stefano

(10) Patent No.: US 8,550,443 B1
(45) Date of Patent: Oct. 8, 2013

(54) METHOD AND APPARATUS FOR HOLDING MICROELECTRONIC DEVICES

(71) Applicant: Centipede Systems, Inc., San Jose, CA (US)

(72) Inventor: Thomas H. Di Stefano, Monte Sereno, CA (US)

(73) Assignee: Centipede Systems, Inc., San Jose, CA (US)

( * ) Notice: Subject to any disclaimer, the term of this patent is extended or adjusted under 35 U.S.C. 154(b) by 0 days.

(21) Appl. No.: 13/932,659

(22) Filed: Jul. 1, 2013

Related U.S. Application Data

(63) Continuation of application No. 12/535,519, filed on Aug. 4, 2009, now Pat. No. 8,485,511.

(60) Provisional application No. 61/159,083, filed on Mar. 11, 2009.

(51) Int. Cl.
*B23Q 3/10* (2006.01)

(52) U.S. Cl.
USPC ......................................................... 269/303

(58) Field of Classification Search
USPC .................. 269/157, 254 R, 317, 303; 439/70
See application file for complete search history.

(56) References Cited

U.S. PATENT DOCUMENTS

| | | | |
|---|---|---|---|
| 4,201,374 A * | 5/1980 | Gras ................................ 269/37 |
| 4,345,810 A | 8/1982 | Bakermans | |
| 4,881,639 A | 11/1989 | Matsuoka et al. | |
| 5,140,405 A | 8/1992 | King et al. | |
| 5,161,983 A | 11/1992 | Ohno et al. | |
| 5,221,209 A | 6/1993 | D'Amico | |
| 5,344,334 A | 9/1994 | Laub et al. | |
| 5,363,038 A | 11/1994 | Love | |
| 5,389,182 A | 2/1995 | Mignardi | |
| 5,494,169 A | 2/1996 | Matsuoka | |
| 5,518,410 A | 5/1996 | Masami | |
| 5,634,267 A | 6/1997 | Farnworth et al. | |
| 5,713,744 A | 2/1998 | Laub | |
| 5,758,776 A | 6/1998 | Slocum et al. | |
| 5,781,021 A | 7/1998 | Ilani | |
| 5,801,452 A | 9/1998 | Farnworth et al. | |
| 5,957,293 A | 9/1999 | Pakeriasamy | |
| 6,012,713 A * | 1/2000 | Gleason et al. ................. 269/47 |
| 6,132,220 A * | 10/2000 | McHugh et al. ................ 439/66 |
| 6,179,127 B1 | 1/2001 | Kato et al. | |
| 6,196,849 B1 * | 3/2001 | Goodwin ......................... 439/71 |
| 6,227,372 B1 | 5/2001 | Thomas et al. | |
| 6,242,933 B1 | 6/2001 | Yap | |
| 6,377,062 B1 | 4/2002 | Ramos et al. | |
| 6,474,477 B1 | 11/2002 | Chang | |

(Continued)

FOREIGN PATENT DOCUMENTS

EP 0220600 A2 5/1987

*Primary Examiner* — Lee D Wilson
*Assistant Examiner* — Jamal Daniel
(74) *Attorney, Agent, or Firm* — Michael B. Einschlag

(57) ABSTRACT

One embodiment is a carrier for releasably holding devices that includes a body having at least one site having a first portion adapted to hold a device, a second portion, and first and second resilient prongs wherein: (a) the first and second resilient prongs each has a distal end extending into the second portion, which distal ends are juxtaposed; and (b) the distal ends are disposed so that movement thereof apart enables a device to be inserted into or to be released from the first portion.

27 Claims, 8 Drawing Sheets

(56) References Cited

U.S. PATENT DOCUMENTS

| | | | |
|---|---|---|---|
| 6,535,007 B2 | 3/2003 | Haas et al. | |
| 6,627,483 B2 | 9/2003 | Ondricek et al. | |
| 6,644,981 B2 * | 11/2003 | Choy | 439/70 |
| 6,672,880 B2 * | 1/2004 | Patel et al. | 439/70 |
| 6,696,849 B2 | 2/2004 | Ban et al. | |
| 6,699,047 B1 * | 3/2004 | McHugh et al. | 439/71 |
| 6,762,611 B2 | 7/2004 | Hubner et al. | |
| 6,848,936 B2 * | 2/2005 | DeFord | 439/526 |
| 6,864,568 B2 | 3/2005 | Kohno et al. | |
| 6,877,993 B2 * | 4/2005 | Palaniappa et al. | 439/73 |
| 6,929,505 B2 | 8/2005 | He et al. | |
| 7,118,385 B1 * | 10/2006 | Bodenweber et al. | 439/71 |
| 7,510,402 B2 * | 3/2009 | Ma et al. | 439/71 |
| 7,900,336 B2 | 3/2011 | Akinwande et al. | |
| 2004/0155646 A1 | 8/2004 | Hoppe | |
| 2005/0196982 A1 * | 9/2005 | Cao et al. | 439/70 |
| 2006/0071656 A1 | 4/2006 | Joung et al. | |
| 2008/0252330 A1 | 10/2008 | Hart et al. | |
| 2012/0139176 A1 * | 6/2012 | Di Stefano | 269/287 |

* cited by examiner

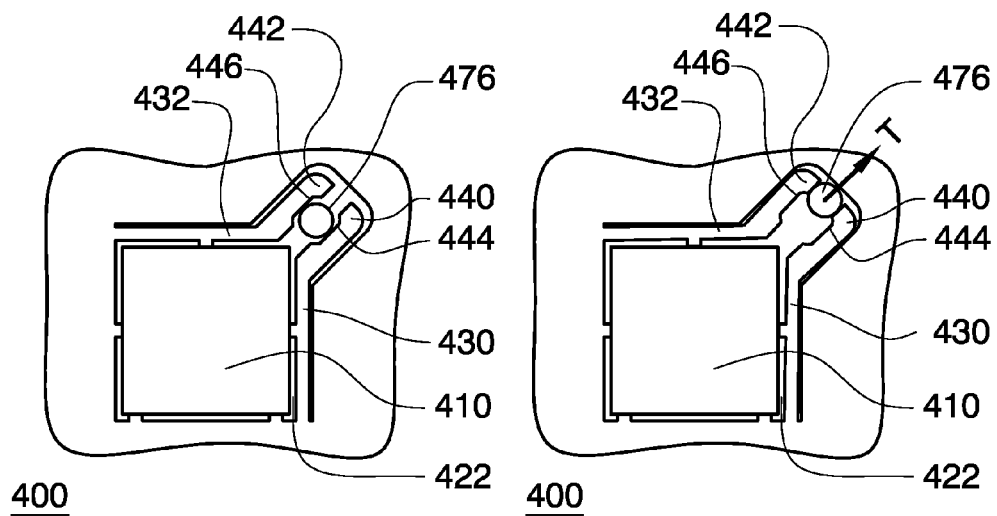
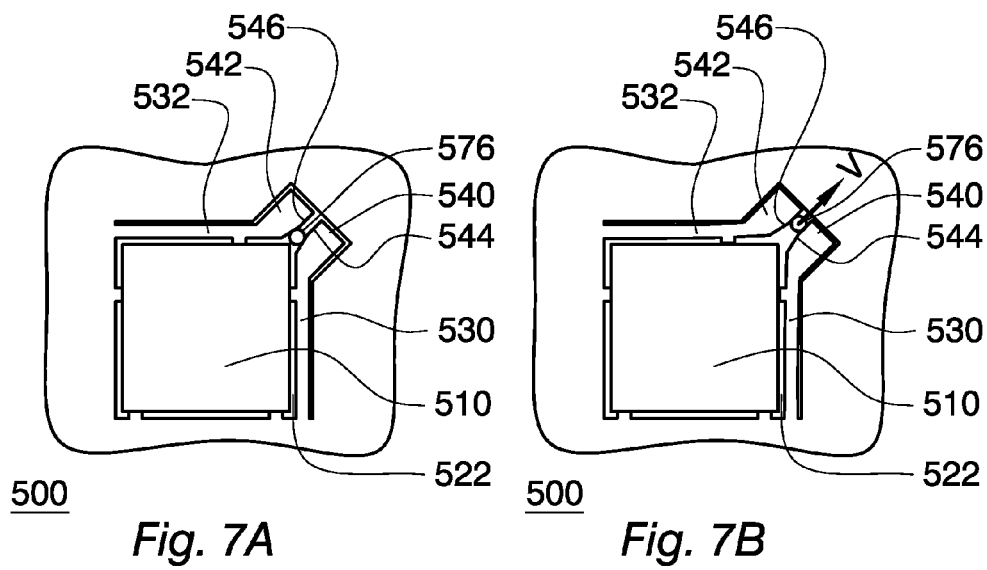

METHOD AND APPARATUS FOR HOLDING MICROELECTRONIC DEVICES

This is a continuation of a patent application entitled "Method and Apparatus for Holding Microelectronic Devices" having Ser. No. 12/535,519 which was filed on Aug. 4, 2009, which patent application relates to U.S. Provisional Application No. 61/159,083 filed Mar. 11, 2009 from which priority is claimed under 35 USC §119(e), and which provisional application and patent application are incorporated herein in its entirety.

TECHNICAL FIELD OF THE INVENTION

One or more embodiments of the present invention relate to holding devices such as, for example and without limitation, microelectronic devices, to enable one or more procedures such as, for example and without limitation, test and/or burn-in, and more specifically to method and apparatus for holding microelectronic devices in an array of microelectronic devices.

BACKGROUND

Semiconductor processing is an increasingly complex and mature technology for which the cost of test and burn-in consumes an ever larger share of production costs. Continuous progress is being made in semiconductor technology and wafer fabrication efficiency, such progress being characterized by Moore's law which has successfully predicted a doubling of the number of devices on a semiconductor chip every two years. Productivity gains from advances in semiconductor technology and wafer fabrication efficiency underlie the modern economy, making possible mobile electronics, internet communications and much of modern life. However, semiconductor packaging and test have not maintained the same pace of technological progress.

Methods commonly used for contacting individual, separated semiconductor chips during testing have remained largely the same for decades. For example, after wafer probe testing, a wafer is sawn apart into individual chips. Additional packaging steps may be used to protect the chip and facilitate its attachment into an electronic system. After packaging, each chip is inserted into a first socket to test for opens and shorts before burn-in. Each chip is then released from the first socket and transported in a tray. In an optional next step, the chip is inserted into a second (burn-in) socket and burned-in for eight hours at an elevated temperature of about 125° C. After burn-in, the chip is removed from the burn-in socket and transported in a tray to final test where it is inserted into a third socket. A comprehensive set of tests is done in final test, which tests are typically done at several speeds and temperatures. The socketing, sockets, fixtures, test boards and handling involved with the process of testing individual chips and other microelectronic devices is an increasing problem in streamlining the production of semiconductor devices.

Attempts have been made to eliminate the need for individual sockets in test and burn-in, with limited success in certain segments of the industry. For example, wafer probe testing using full wafer contactors has been used to burn-in and test all chips on a wafer in parallel, simultaneously. In DRAM and FLASH memory production, wafer probe testing is now being done in parallel for each chip on a wafer. However, at present, cost and performance limitations prevent the practical use of full wafer contactors to burn-in and performance test all chips on a wafer. In particular, for more complex chips such as microprocessors, signal processors, ASICS and communications chips, the high I/O count, power and performance associated with these complex chips prevent use of full wafer contactors for anything other than simple wafer probe testing at best. Although considerable resources, including work in university, U.S. government and industrial laboratories, have been devoted to full wafer burn-in and speed testing, the problem of finding a practical solution remains unsolved.

Other attempts to test and burn-in devices have been made which entail contacting a strip of partially packaged chips. In the process of packaging semiconductor chips as chip scale packages (CSPs) or ball grid arrays (BGAs), an array of chips is held together in a strip format. An array contactor is then used to test and burn-in arrays of chips in the strip format by having the array contactor contact terminals on each partially packaged chip without using a single chip socket. After testing, the process of packaging the chips is completed, and the strip is sawn into individual finished devices. While testing in a strip format eliminates the need for individual costly sockets for some electrical tests, strip testing is only applicable to packages that are processed in strip format. A further limitation results from a complication of the process flow wherein devices leave a packaging area to be tested in a test facility, and then return to packaging for finishing and singulation into individual devices.

Another approach involves placing chips, whether packaged or not, in an accurately positioned array on a carrier. To provide accurate placement of chips on the carrier which is needed for registering terminals on the chips to mating contactors, each chip must be loaded onto the carrier precisely. Accurate registration ensures that the pads of a device reliably and repeatedly contact corresponding pads of the tester. Misregistration of the chip is only detected at a testing station when electrical signals are applied to the chip. However, registration is addressed in the art by testing the chip or chips on a carrier immediately after placement of each chip on the carrier. This approach has a limitation in that chips on a carrier cannot be transported through the process from test for opens and shorts, to burn-in, and then to final test while maintaining registration.

SUMMARY

According to one or more embodiments of the invention, a device, for example and without limitation, a microelectronic device, is releasably held in a carrier wherein the device is positioned with respect to the carrier, In accordance with one or more such embodiments, the carrier is positioned with respect to contact probes for test or burn-in of the device. In particular, one embodiment is a carrier for releasably holding devices that comprises: a body having one or more sites having a first portion adapted to hold a device and a second portion; and at least one of the one or more sites having a first resilient prong and a second resilient prong; wherein: (i) the first resilient prong has: (a) an end affixed to the body in the first portion, (b) a first prong body disposed in the first portion, and (c) a distal end extending into the second portion; (ii) the second resilient prong has: (a) an end affixed to the body in the first portion, (b) a second prong body disposed in the first portion, and (c) a distal end extending into the second portion; (iii) (a) at least a portion of an edge of the distal end of the first prong (first distal edge) is juxtaposed to at least a portion of an edge of the distal end of the second prong (second distal edge), (b) at least a portion of an edge of the first prong body (first prong body edge) is disposed to enable it to resiliently hold the device against an edge of a first portion of a perimeter of the first portion (first perimeter portion), and (c) at least a portion of an edge of the second prong body (second prong body edge) is disposed to enable it to resiliently hold the device against an edge of a second portion of the perimeter of the first portion (second perimeter portion); and (iv) the first distal edge and the second distal edge are disposed so that movement thereof apart causes movement of the first prong edge away from the first perimeter portion and movement of the second prong edge away from the second perimeter portion.

BRIEF DESCRIPTION OF THE DRAWINGS

FIG. 3A shows an empty carrier; FIG. 3B shows a carrier with chips in each aperture in an open configuration; and FIG. 3C shows a carrier with chips held in each aperture in a closed configuration.

FIGS. 6A and 6B are top views of a site in a carrier for holding microelectronic devices that is fabricated in accordance with one or more embodiments of the present invention, the site being shown in a closed configuration and in an open configuration, respectively.

FIGS. 7A and 7B are top views of a site in a carrier for holding microelectronic devices that is fabricated in accordance with one or more embodiments of the present invention, the site being shown in a closed configuration and in an open configuration, respectively.

FIG. 10A shows the cams disposed so that the carrier sites are in a closed configuration, and FIG. 10B shows the cams disposed after movement (for example and without limitation, by rotation) so that the carrier sites are in an open configuration.

DETAILED DESCRIPTION

In accordance with one or more embodiments of the present invention, a carrier (also referred to herein as a tray) is provided for holding devices, for example and without limitation, microelectronic devices, in place so that the devices may be moved to a socket, for example and without limitation, a test socket, and so that the devices may be aligned with mating contactors, for example and without limitation, test contactors (for example, an electrode terminal of a socket), in the socket, for example and without limitation, the test socket.

As used herein, the term device is used in the broadest sense and includes, without limitation, an electronic device and a microelectronic device including a semiconductor chip, a flip chip, a packaged electronic circuit, a hybrid circuit, a daughter card, a multi-chip module, and the like. As further non-limiting examples of the types of microelectronic devices which may be held in a carrier fabricated in accordance with one or more embodiments of the present invention are BGAs (as used herein the term BGA, or ball grid array, is a two dimensional array of solder bump terminals on a microelectronic device), CSPs (as used herein, the term CSP is a chip scale package), flip-chips, wafer level packages (WLPs), bare semiconductor dice, MEMS, and multi-chip modules.

Figure 1A:
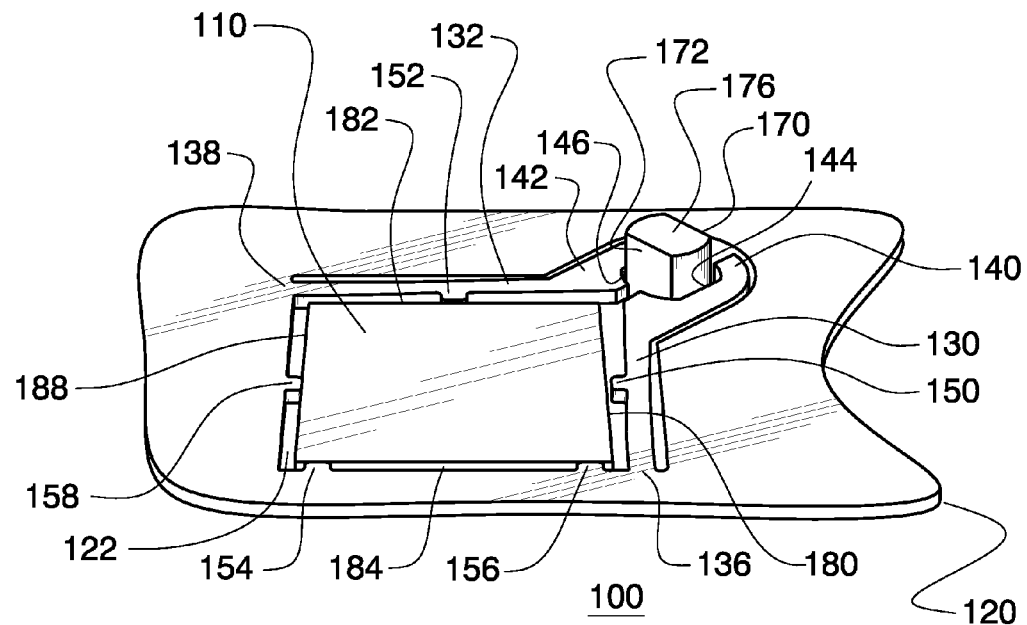
FIGS. 1A and 1B are perspective views of a site in a carrier for holding microelectronic devices that is fabricated in accordance with one or more embodiments of the present invention, the site being shown in an open and in a closed configuration, respectively.
Figure 1B:
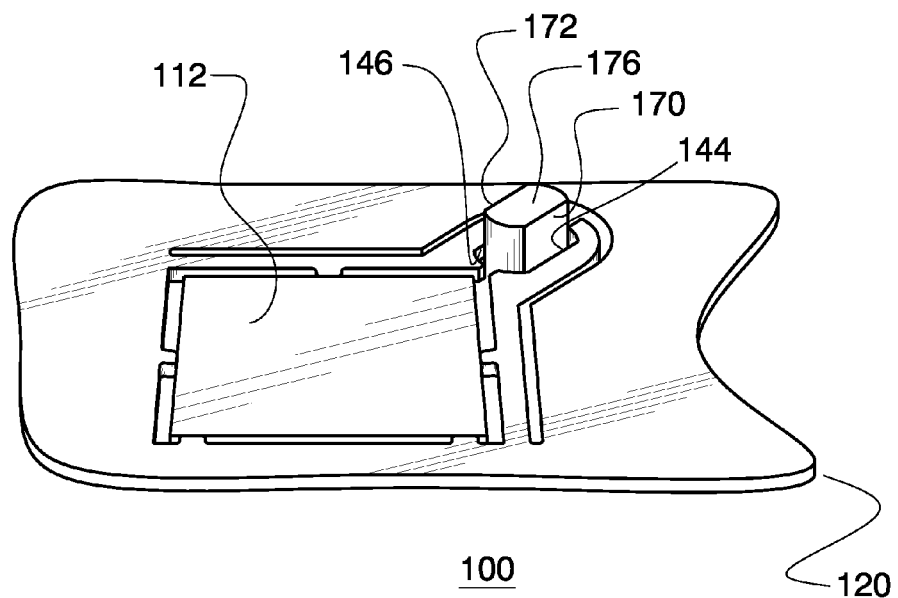
Figure 2A:
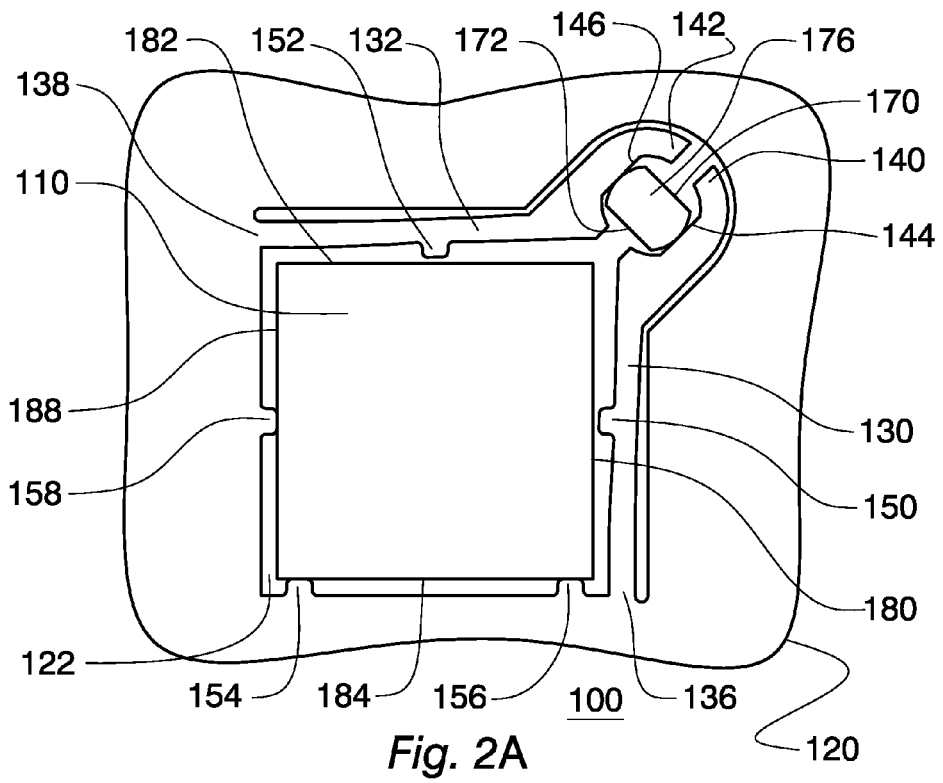
FIGS. 2A and 2B are top views of a site in a carrier for holding microelectronic devices that is fabricated in accordance with one or more embodiments of the present invention, the site being shown in an open and in a closed configuration, respectively.
Figure 2B:
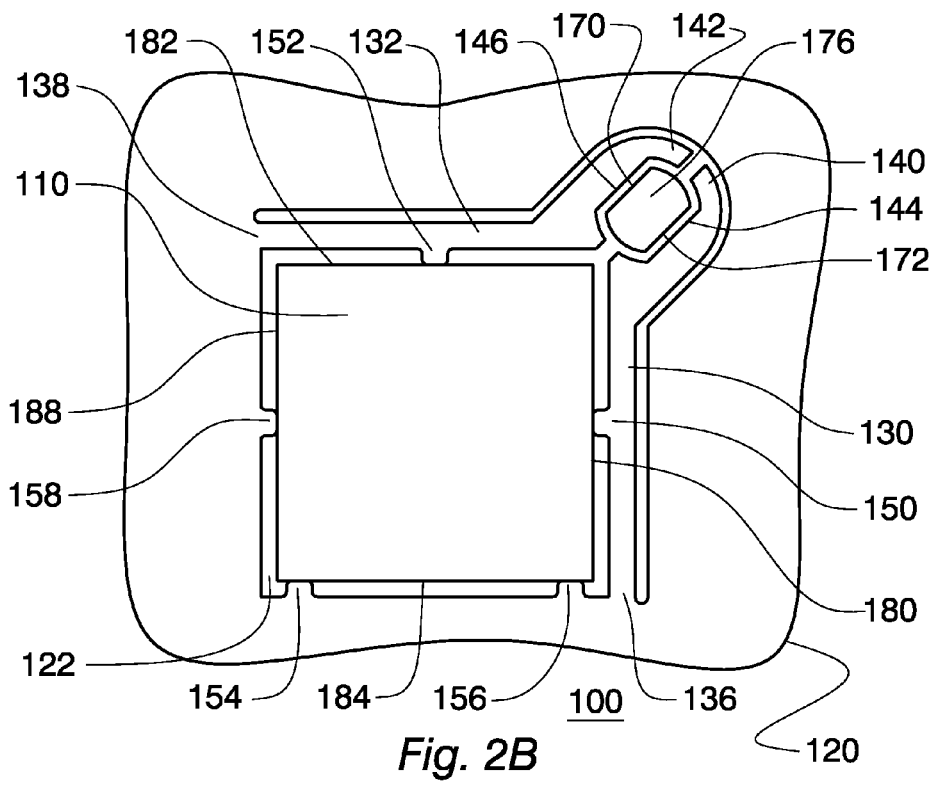

In accordance with one or more embodiments of the present invention, a carrier comprises one or more sites arrayed in a planar body. As used herein, a site is a location within a carrier for one device. FIGS. 1A and 1B are perspective views of site 100 in a carrier for holding microelectronic devices that is fabricated in accordance with one or more embodiments of the present invention, site 100 being shown in an open and in a closed configuration, respectively; and FIGS. 2A and 2B are top views of site 100, site 100 being shown in an open and in a closed configuration, respectively. As used herein, the expression "respectively" means that a first item in a first list relates to a first item in a second list; a second item in the first list relates to a second item in the second list; and so forth.

As shown in FIG. 1A, site 100 includes aperture 122 in planar body 120, where aperture 122 (for example, an opening through planar body 120) is shaped to receive semiconductor chip 110 in the manner described below. As further shown in FIG. 1A, site 100 comprises resilient, elongated prongs 130 and 132 that are attached at ends 136 and 138, respectively, to planar body 120 (ends 136 and 138 may also be referred to herein as fixed ends or proximal ends). In accordance with one or more embodiments of the present invention, a prong is a spring element that acts in a plane of planar body 120 to position and retain a microelectronic device in place in the carrier as described below. In accordance with one or more such embodiments, prongs 130 and 132 are attached at ends 136 and 138, respectively, so that prongs 130 and 132 may be flexed, for example, in a direction away from a portion of aperture 122 in which a device may be held ("holding portion"). Distal ends 140 and 142 of prongs 130 and 132, respectively, extend beyond the holding portion of aperture 122 and are movable in a plane, for example, the plane of planar body 120. In accordance with one or more embodiments of the present invention, each of distal ends 140 and 142 may be resiliently connected by a spring-like member to body 120 or to its corresponding opposite distal end. In accordance with one or more embodiments of the present invention, distal end 140 of prong 130 extends beyond a portion of prong 130 (also referred to herein as a prong body) that may hold a device in the manner described below, and distal end 142 of prong 132 extends beyond a portion of prong 132 (also referred to herein as a prong body) that may hold a device in the manner described below. Further at least a portion of an edge of distal end 140 (an actuating edge) is juxtaposed to at least a portion of an edge of distal end 142 (an actuating edge).

As further shown in FIG. 1A, in accordance with one or more such embodiments, prong 130 includes lateral boss 150 (i.e., a protrusion that is a part of an edge of the prong body of prong 130, also referred to herein as a contactor edge) that is adapted to bear against edge 180 of chip 110, thereby urging edge 188 of chip 110 against lateral boss 158 in an opposite wall of aperture 122 (where lateral boss 158 is a protrusion that is a part of an edge of the wall, also referred to herein as a contactor edge). Similarly, and as further shown in FIG. 1A, prong 132 includes lateral boss 152 (i.e., a protrusion that is a part of an edge of the prong body of prong 132, also referred to herein as a contactor edge) that is adapted to bear against edge 182 of chip 110, thereby urging edge 184 of chip 110 against lateral bosses 154 and 156 in an opposite wall of aperture 122 (where lateral bosses 154 and 158 are protrusions that are a part of an edge of the wall, also referred to herein as a contactor edge). One of ordinary skill in the art can readily appreciate that lateral boss 150 disposed on an edge of the body of a prong 130 represents a portion of an edge of the body of prong 130; lateral boss 152 disposed on an edge of the body of a prong 132 represents a portion of an edge of the body of prong 132; lateral boss 158 disposed on an edge of a wall of aperture 122 represents a portion of an edge of the wall of aperture 122; and lateral bosses 154 and 156 disposed on an edge of a second wall of aperture 122 represent a portion of an edge of the second wall of aperture 122. One of ordinary skill in the art should appreciate that further embodiments of the present invention may be fabricated where prongs 130 and 132 do not have lateral bosses or where prongs 130 and 132 have more than one lateral boss. In addition, one of ordinary skill in the art should also appreciate that further embodiments of the present invention may be fabricated where one or more walls of aperture 122 do not have lateral bosses or where one or more walls of aperture 122 have one lateral boss or have more than two lateral bosses.

As further shown in FIG. 1A, in accordance with one or more such embodiments, cam 176 (for example and without limitation, having a rectangular or oval shaped cross section) may be inserted between distal ends 140 and 142 of prongs 130 and 132, respectively. As used herein, an open configuration of a site is a configuration where distal ends 140 and 142 of prongs 130 and 132, respectively, are separated enough so that the device is free to be removed from the carrier; and a closed configuration of the site is a configuration where the prongs are released so that distal ends 140 and 142 can resiliently relax enough so that the device may be held in position on the carrier. As used herein, a cam is a mechanical element used to urge the distal ends of adjacent prongs apart.

FIGS. 1A and 2A show site 100 in an open configuration wherein chip 110 may be inserted into or withdrawn from aperture 122. As shown in FIGS. 1A and 2A, in the open configuration, lateral bosses 150 and 152 in prongs 130 and 132, respectively, are drawn away from chip 110 by actuation of cam 176 whereby distal ends 140 and 142 of prongs 130 and 132, respectively, are urged apart. In accordance with one or more embodiments of the present invention, actuation of cam 176 is accomplished by rotating rotatable cam 176 about its axis (using any one of a number of methods that are well known to those of ordinary skill in the art) to urge cam surfaces 170 and 172 against lateral faces 144 and 146 (i.e., edges) of distal ends 140 and 142 of prongs 130 and 132, respectively. Rotating cam 176 forces distal ends 140 and 142 of prongs 130 and 132, respectively, apart, thereby flexing prongs 130 and 132 to cause them to move in the plane of planar body 120, and away from the center of aperture 122, thereby moving lateral bosses 150 and 152 away from edges 180 and 182, respectively, of chip 110. In the open configuration, bosses 150 and 152 are retracted away from edges 180 and 182 of chip 110, respectively, allowing chip 110 to be placed into, and removed from, aperture 122. As shown in FIG. 2A, in accordance with one or more embodiments of the present invention, distal ends 140 and 142 have been fabricated to provide a chamber within which cam 176 may be inserted. As further shown in FIGS. 2A and 2B, the chamber is configured so that cam 176 may be disposed in a: (a) first orientation where prongs 130 and 132 are enabled to resiliently relax sufficiently to be able to hold chip 110; and (b) second orientation where cam 176 urges distal ends 140 and 142 apart.

FIGS. 1B and 2B show site 100 in a closed configuration wherein chip 110 is held in accurate registration with respect to the carrier such that the carrier and chip may be transported, stored or loaded onto a socket contactor without losing registration. As used herein, registration means alignment of terminal pads on a microelectronic device to contactors of a mating socket. Site 100 is placed in the closed configuration by rotating rotatable cam 176 about its axis (using any one of a number of methods that are well known to those of ordinary skill in the art) so that cam surfaces 170 and 172 disengage from lateral faces 144 and 146 of prong distal ends 140 and 142, respectively, thereby allowing prong distal ends 140 and 142 to move in the plane of body 120 resiliently toward one another. As such, elongated prongs 130 and 132 relax resiliently in the plane of body 120, and move toward the center of aperture 122, thereby urging lateral bosses 150 and 152 against edges 180 and 182 of chip 110, respectively. Chip 110 is held between lateral boss 150 which resiliently urges upon edge 180, and opposing lateral boss 158 which, in reaction, urges upon edge 188. In addition, in another direction in the plane of body 120, chip 110 is held between lateral boss 152 which urges upon edge 182, and opposing lateral bosses 154 and 156 which, in reaction, urge upon edge 184. As one of ordinary skill in the art can readily appreciate from this, chip 110 is oriented into registration by action of lateral bosses 150 and 152 urging chip 110 into mechanical contact with opposing bosses: lateral boss 158 mechanically contacts edge 188; lateral boss 154 mechanically contacts edge 184; and lateral boss 156 mechanically contacts edge 184. In addition to accurate registration, urging of lateral bosses 150 and 152, and, in reaction, urging of bosses 154, 156 and 158 against chip 110 holds chip 110 securely in place within aperture 122 and prevents chip 110 from falling out of carrier site 100.

In accordance with one or more embodiments of the present invention, aperture 122 may extend through planar body 120, thereby allowing access to top surface 112 of chip 110 for direct chip cooling, while allowing access to a bottom surface of chip 110 for connection to contactor probes of a test socket. Alternatively, aperture 122 may have a bottom structure so that chip 110 is prevented from falling downward and out of aperture 122 when aperture 122 is opened. In accordance with one or more embodiments of the present invention, the bottom structure may comprise tabs or a sheet of material with or without apertures therein. In accordance with one or more such embodiments, the bottom structure comprises a thin sheet of copper, copper alloy, steel, polyimide, or other suitable material. In accordance with yet further embodiments, the bottom structure comprises a thin sheet with embedded contactors disposed through the sheet whereby electrical connections may be made between terminals on a bottom side of chip 110 and corresponding terminals of a mating socket. Embedded contactors include without limitation terminals with roughened surfaces, spring probes, resilient metal vias, cantilever probes, buckling beam probes, flat spring probes, and the like.

In accordance with one or more embodiments of the present invention, body 120 may be made of a sheet of full hardness tempered 304 stainless steel having, for example and without limitation, a thickness of 0.25 mm. In accordance with one or more such embodiments, the features of site 100 that are shown in FIGS. 1A to 2B and are described above may be laser cut in a full hardness tempered 304 stainless steel sheet to an accuracy of +/−5 micrometers; elongated prongs 130 and 132 may be approximately 0.5 mm wide; end edge faces 144 and 146 of prongs 130 and 132 may be parallel and may be separated by a 1.0 mm spacing when holding a device; and body 120 may be coated with a thin dielectric film, for example and without limitation, of e-coat electrodeposited coating that is available from Pittsburgh Plate Glass, Pittsburgh, Pa. In accordance with one or more embodiments of the present invention, a carrier may comprise one or more sites like site 100 that are arranged in an array on a planar body 120. As used herein, an array is an ordered assembly of sites positioned for testing purposes. In accordance with one or more alternative embodiments, carrier body 120 may be made of a material including without limitation stainless steel, tempered steel, Monel 500, glass fiber reinforced polyimide, Aramid fiber reinforced polyimide (available from Arlon, Inc.), NiTi shape memory alloy (available from National Electronic Alloys, Inc. of Santa Ana, Calif.), carbon fiber reinforced polymer, or a resilient plastic material.

In accordance with one or more embodiments of the present invention, cam 176 may be formed from a stainless steel cylinder, for example and without limitation, having a diameter of 1.25 mm by flattening it on two sides to form flat faces 170 and 172. To insert cam 176 at site 100, cam 176 is first oriented so that flat faces 170 and 172 are parallel to edge faces 144 and 146 of prongs 130 and 132, respectively. Then, cam 176 is inserted into a gap between edge faces 144 and 146. In accordance with one or more embodiments of the present invention, the site is opened by rotating cam 176 by 90° from the cam orientation shown in FIG. 1B to the cam orientation shown in FIG. 1A. The rotational movement of cam 176 urges edge faces 144 and 146 apart, thereby spreading prongs 130 and 132 to release chip 110. While rotational motion of cam 176 is preferred, as described below, other cam motions are useful for opening the apertures in a carrier fabricated in accordance with one or more embodiments of the present invention.

Figure 3A:
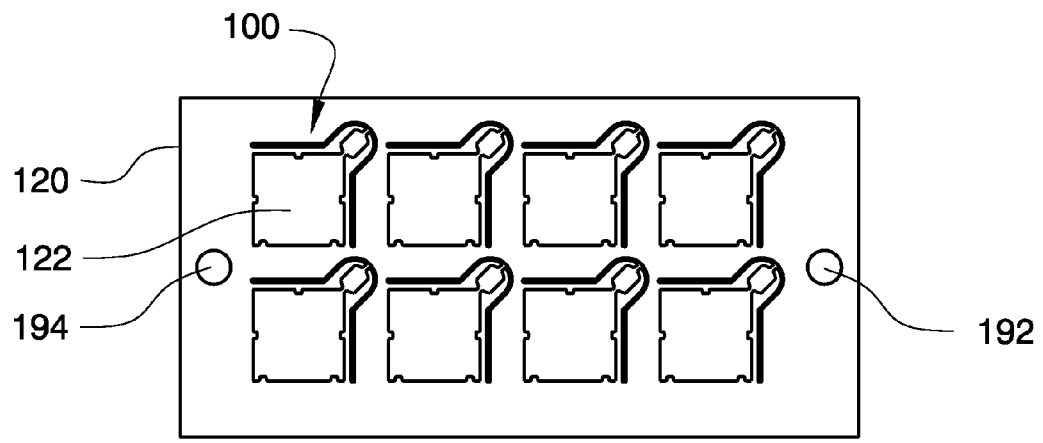
FIGS. 3A-3C are top views of a carrier for holding microelectronic devices that is fabricated in accordance with one or more embodiments of the present invention, the carrier being shown in successive stages of operation.
Figure 3B:
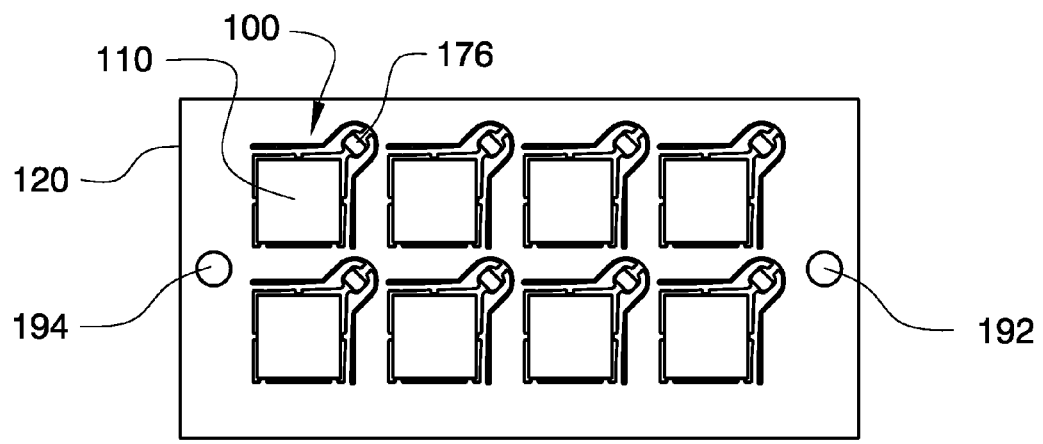
Figure 3C:
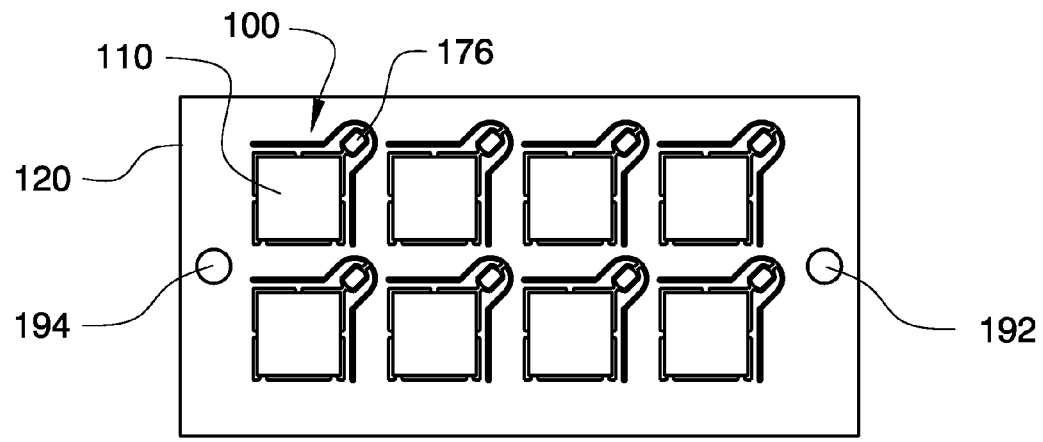

FIGS. 3A-3C are top views of carrier 190 for holding devices that is fabricated in accordance with one or more embodiments of the present invention. FIGS. 3A-3C show carrier 190 in successive stages of operation: (a) FIG. 3A shows an empty carrier; (b) FIG. 3B shows a carrier with chips in each aperture in an open configuration; and (c) FIG. 3C shows a carrier with chips held in each aperture in a closed configuration. As shown in FIGS. 3A-3C, a plurality of sites 100 may be disposed in an array on carrier 190 where site 100 has been described above in conjunction with FIGS. 1A to 2B. For clarity of exposition, numerical labeling of the elements of each site 100 is omitted as having been defined in FIGS. 1A to 2B. In addition to an array of sites 100, carrier 190 includes alignment features 192 and 194 that may be used to align carrier 190 to a mating element such as, for example and without limitation, a test socket, a burn-in socket, or a processing head.

FIGS. 3A-3C illustrate a sequence of steps in the use of carrier 190 to hold microelectronic devices. In a first step, as shown in FIG. 3A, carrier 190 comprises an array of sites 100 where each of the sites is in a quiescent closed configuration wherein no chip is held in aperture 122 associated with each site 100. In a next step, cam 176 associated with each site 100 is inserted between two movable distal ends 140 and 142 of prongs 130 and 132, respectively, associated with each site 100. Then, cam 176 is rotated by 90° such that flat faces 170 and 172 of cam 176 are disposed at an angle with respect to edges 144 and 146 (actuating edges) of prong distal ends 140 and 142, respectively, as shown in FIG. 3B. Preferably, flat face 170 and edge 144 are perpendicular. As shown in FIG. 3B, apertures 122 of carrier 190 are in an open configuration to allow semiconductor chips 110 to be inserted into each aperture 122. With each site 100 of carrier 190 disposed in the open configuration, chips 110 are inserted into apertures 122 by a conventional pick and place machine with a placement accuracy of, for example and without limitation, +/−50 micrometers. In a next step, cams 176 are rotated by 90°, thereby allowing distal ends 140 and 142 of resilient prongs 130 and 132, respectively, to relax in the plane of carrier 190. Lateral bosses 150 and 152 on prongs 130 and 132, respectively, of each site 100 move into contact with edges of each chip 110, thereby urging each chip 110 against alignment bosses 154, 156 and 158 of each site 100 that align each chip 110 with respect to carrier 190. In the closed configuration of FIG. 3C, chips 110 are held in their respective apertures by lateral bosses 150, 152, 154, 156 and 158, thereby holding chips 110 securely in apertures 122.

In the closed configuration, carrier 190 with an array of chips 110 may be transported and aligned for various purposes including, for example and without limitation, burn-in, test, laser trimming, marking, plasma cleaning, chemical cleaning, rinsing, baking, chip stacking, shipping, and processing. By way of example and without limitation, a plurality of chips in a carrier may be joined to corresponding ones of a plurality of chips in a second carrier by juxtaposing the first carrier to the second carrier, and then joining the carriers using any one of a number of methods that are well known to those of ordinary skill in the such as, for example and without limitation, solder joining, thermosonic bonding, or other joining methods known in the art. By thusly joining carriers, chips such as through silicon via (TSV) chips, may be stacked accurately and efficiently.

Figure 8:
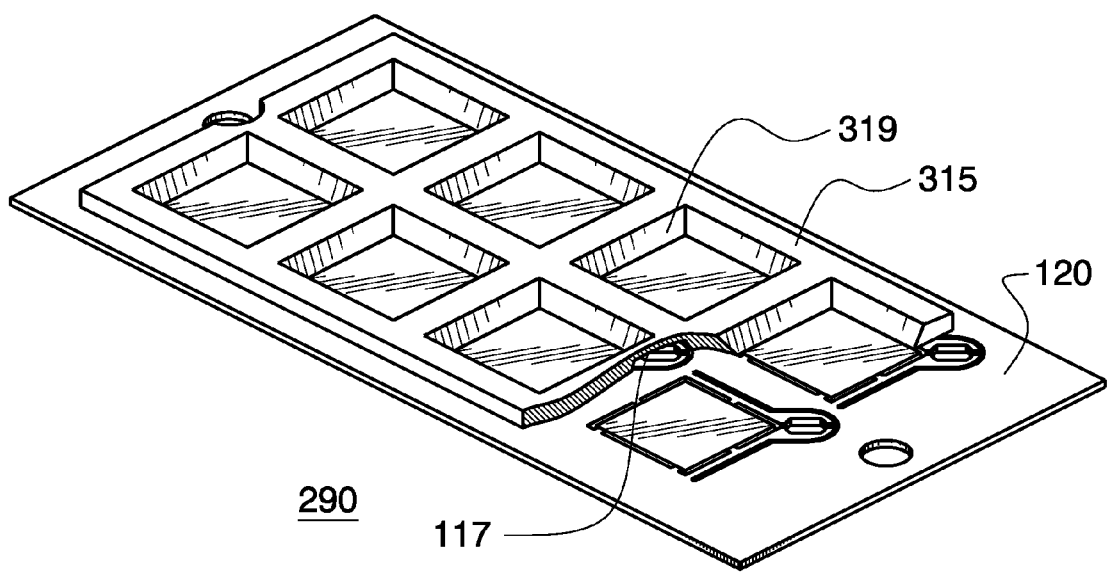
FIG. 8 is a cutaway perspective view of a carrier for holding devices that is fabricated in accordance with one or more embodiments of the present invention.

While carrier 190 (which is fabricated from a multiplicity of sites like site 100 shown in FIGS. 1A to 2B) is substantially planar, it will be understood by one of ordinary skill in the art that carriers fabricated in accordance with one or more embodiments of the present invention may include additional features that facilitate loading and unloading of various types of microelectronic devices. By way of example and not limitation, a beveled frame may be added to planar body 120 to guide devices into apertures like aperture 122 at sites like site 100. In accordance with one or more such embodiments of the present invention, the beveled frame may be formed individually, i.e., with one frame per site, or beveled frames may be formed in an array that is attached to planar body 120. As used herein, a frame is a "picture frame," typically fabricated from molded plastic material, which frame is used to guide a device into an aperture in the carrier. FIG. 8 is a cutaway perspective view of carrier 290 for holding devices that is fabricated in accordance with one or more embodiments of the present invention. As shown in FIG. 8, carrier 290 includes body 120 (fabricated like body 120 of carrier 190 shown in FIGS. 3A-3C) and beveled frame 315. As shown in FIG. 8, beveled frame 315 has apertures 319 with sloping sides that help guide devices into apertures at sites in carrier 290. As one of ordinary skill in the art can readily appreciate, many embodiments of beveled frame 315 may be fabricated that include variations from beveled frame shown in FIG. 8. For example and without limitation, a portion of the frame need not surround each site (for example, a frame portion associated with a site need not include four (4) sides), or even be present at each site. In addition, the frame may include recesses to enable the cams to be inserted a predetermined distance therein to provide more reliable contact with actuating edges of prongs. In accordance with one or more such embodiments, a beveled frame may be fabricated using any one of a number of conventionally practiced methods of plastic molding. Suitable plastics for fabricating beveled frames include, for example and without limitation, FR-4 epoxy, liquid crystal polymer, polyether ether ketone (PEEK), polyether sulfone (PES), and polyamide-imide (Torlon® available from Quadrant Engineering Plastics, Reading, Pa.).

In accordance with one or more further embodiments of the present invention, body 120 of a carrier may be stamped, or otherwise formed, to include alignment features, orientation features, stops, stacking elements, bottom stops and the like, that facilitate the use of carriers across a wide spectrum of applications (see further description below). In addition, and in accordance with one or more embodiments of the present invention, the thickness of body 120 may be adapted to the devices being held in the carrier (note that in accordance with various embodiments, at some or all sites, the device may be thicker than the body, and in accordance with other embodiments, the body may be thicker than the device). For example and without limitation, the thickness of the body may range from a thin sheet of about 0.1 mm in thickness for use in a flip chip application to a molded plastic sheet of about 5 mm in thickness for use with a MEMS pressure sensor device. As discussed herein, the thickness of body 120 does not take into account the thickness of any beveled frame used for guiding devices into the apertures of a carrier.

In accordance with one or more embodiments of the present invention, the prongs need not be planar, and/or the body of the carrier need not be planar. Thus, as one of ordinary skill in the art can also appreciate in light of the above, in accordance with one or more embodiments of the present invention, a carrier for releasably holding devices comprises: a body having one or more sites having an aperture with a portion in which a device may be held (holding portion); and at least one of the one of more sites having a first resilient prong and a second resilient prong; wherein: (i) the first resilient prong has: (a) an end (proximal end) affixed to the body, (b) a prong body, and (c) a distal end extending beyond the holding portion; (ii) the second resilient prong has: (a) an end (proximal end) affixed to the body, (b) a prong body, and (c) a distal end extending beyond the holding portion; (iii) an edge of a first portion of a perimeter of the aperture and an edge of a second portion of the perimeter are disposed in a plane; (iv) at least a portion of an edge of the first prong body and at least a portion of an edge of the second prong body are disposed in and are movable in the plane; (v) (a) at least a portion of an edge of the distal end of the first prong is juxtaposed to at least a portion of an edge of the distal end of the second prong, (b) the at least a portion of the edge of the first prong body is disposed to enable it to resiliently hold the device against the edge of the first portion of the perimeter, and (c) the at least a portion of the edge of the second prong body is disposed to enable it to resiliently hold the device against the edge of the second portion of the perimeter; and (vi) the at least a portion of the edge of the distal end of the first prong and the at least a portion of the edge of the distal end of the second prong are adapted to be moved apart to enable the device to be placed into or released from the carrier. In addition, as one of ordinary skill in the art can also appreciate in light of the above, in accordance with one or more embodiments of the present invention, a carrier for releasably holding devices in a contact plane comprises: a body having one or more sites each having an aperture with a portion in which a device may be held (holding portion); and at least one of the one or more sites having a first resilient prong and a second resilient prong; wherein: (i) the first resilient prong has: (a) a proximal end affixed to the body, (b) a first contactor edge disposed in the contact plane, and (c) a movable distal end extending beyond the holding portion; (ii) the second resilient prong has: (a) a proximal end affixed to the body, (b) a second contactor edge disposed in the contact plane, and (c) a movable distal end extending beyond the holding portion; (iii) a contactor edge of a first portion of a perimeter of the aperture (third contactor edge) and a contactor edge of a second portion of the perimeter are disposed in the contact plane (fourth contactor edge); (iv) an actuating edge of the movable distal end of the first prong (first actuating edge) is juxtaposed to an actuating edge of the movable distal end of the second prong (second actuating edge); (v) the first contactor edge is disposed to enable it to resiliently hold the device against the third contactor edge and the second contactor edge is disposed to enable it to resiliently hold the device against the fourth contactor edge; and (vi) urging apart the first actuating edge from the second actuating edge enables the device to be placed into or released from the carrier.

Figure 9:
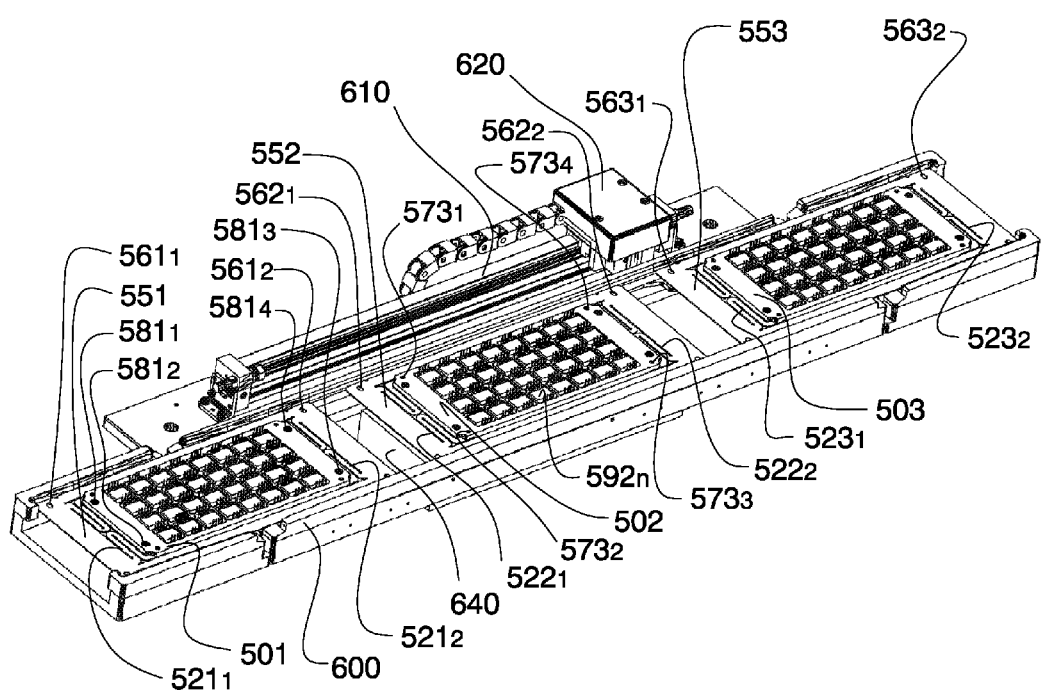
FIG. 9 is a top view of several carriers being held for use in testing and/or burn-in testing in accordance with one or more embodiments of the present invention.

FIG. 9 is a top view of carrier holders 551-553 being slidably supported on track 600 for use in testing and/or burn-in testing in accordance with one or more embodiments of the present invention. As shown in FIG. 9, track 600 supports carrier holders 551-553, each of which includes a mesh of serpentine flat springs (springs $521_1$ and $521_2$; springs $522_1$ and $522_2$; and springs $523_1$ and $523_2$) that form spring beds for carriers 501-503. In operation, flat springs $522_1$ and $522_2$ provide resiliency that allows devices $592_n$ held in carrier 502 to be urged downwardly into contact with socket 640 by a test head (not shown) mounted above carrier 502. As further shown in FIG. 9, carriers 501-503 are held in place on carrier holders 551-553 by four (4) pins (for example, pins $581_1$-$581_4$ affixed to carrier 501). As further shown in FIG. 9, mobile trolley 620 mounted to pneumatic drive 610 transports carrier holders 551-553 along track 600. Pins (not visible in FIG. 9) on trolley 620 engage with transport apertures $562_2$ and $563_1$ on carrier holders 552 and 553, respectively, thereby allowing the trolley to move both carrier holders 552 and 553 into position simultaneously. Each end of carrier holders 551, 552 and 553 has one or more transport apertures (including $561_1$ and $561_2$; $562_1$ and $562_2$; and $563_1$ and $563_2$, respectively) that allow engagement for transport from either end of the carrier holder. As further shown in FIG. 9, apertures (for example, apertures $573_1$-$573_4$ disposed in carrier 503) may be used to align the carriers with test sockets. In accordance with one or more further embodiments, of the present invention, carriers may be transported by robots, slides, belts, magnetic levitation tracks, or manually, all of which embodiments may be fabricated by one of ordinary skill in the art in light of the description herein. Further, in accordance with one or more embodiments of the present invention, various identification marks, alignment features, tracking labels and the like may be added to a carrier in accordance with any one of a number of methods that are well known to one of ordinary skill in the art of conventional semiconductor packaging and testing.

FIGS. 4A-7B show one or more alternative embodiments to using the rotating cam described above to open the prongs of an aperture in a carrier. Each embodiment shown in FIGS. 4A-7B is shown in a closed configuration and in an open configuration. For clarity of illustration, labels on features that are common with the embodiments shown in FIGS. 1A-3C are omitted. For each configuration, the distal ends of two resilient prongs are forced apart by motion of a cam inserted between the distal ends of the two prongs.

Figure 4A:
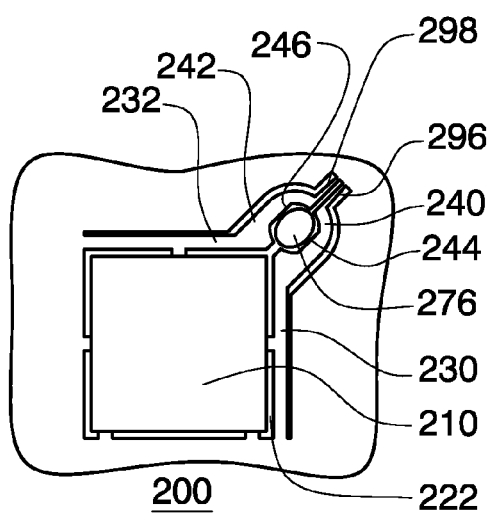
FIGS. 4A and 4B are top views of a site in a carrier for holding microelectronic devices that is fabricated in accordance with one or more embodiments of the present invention, the site being shown in a closed configuration and in an open configuration, respectively.
Figure 4B:
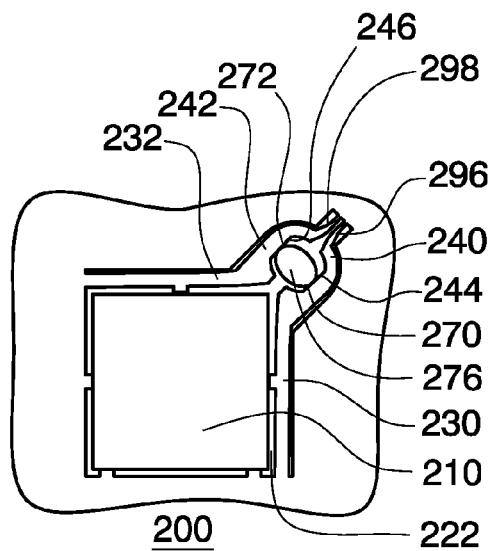

FIG. 4A is a top view of site 200 of a carrier that is fabricated in accordance with one or more embodiments of the present invention where site 200 is shown in a closed configuration holding chip 210 in aperture 222. As shown in FIG. 4A, in accordance with one or more such embodiments of the present invention, distal ends 240 and 242 of prongs 230 and 232, respectively, have been fabricated to provide a chamber within which cam 276 may be inserted. As further shown in FIG. 4A, cam 276 is inserted between opposing edges 244 and 246 (actuating edges) of distal ends 240 and 242 of prongs 230 and 232, respectively. As further shown in FIG. 4A, edges 244 and 246 of prongs 230 and 232, respectively, are movably restrained by flat springs 296 and 298 that are attached to prong distal ends 240 and 242, respectively. As one of ordinary skill in the art can readily appreciate, flat springs 296 and 298 restrain movement of probe distal ends 240 and 242, respectively, in a direction perpendicular to the plane of site 200. Notwithstanding the movable restraint of probe distal ends 240 and 242 provided by flat springs 296 and 298, in accordance with one or more embodiments of the present invention, probe distal ends 240 and 242 may be moved apart by motion of cam 276 urging upon opposing edges 244 and 246. FIG. 4B is a top view of site 200 in an open configuration in which cam 276 is rotated by 90° from its position as shown in FIG. 4A. As shown in FIG. 4B, faces 270 and 272 of cam 276 urge outwardly against edges 244 and 246, respectively, thereby moving prongs 230 and 232 apart and away from chip 210 in aperture 222. In accordance with one or more such embodiments, in the open configuration, chip 210 is free to be removed from site 200.

Figure 5A:
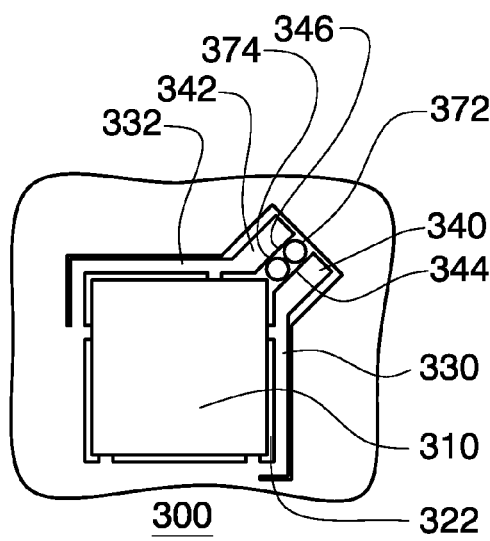
FIGS. 5A and 5B are top views of a site in a carrier for holding microelectronic devices that is fabricated in accordance with one or more embodiments of the present invention, the site being shown in a closed configuration and in an open configuration, respectively.
Figure 5B:
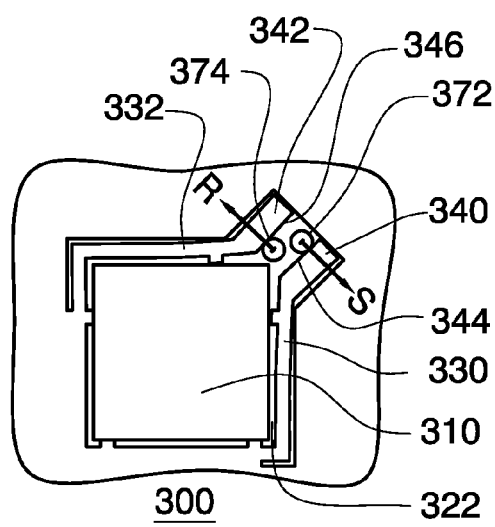

FIG. 5A is a top view of site 300 of a carrier that is fabricated in accordance with one or more embodiments of the present invention where site 300 is shown in a closed configuration holding chip 310 in aperture 322. As shown in FIG. 5A, a cam comprising cam rods 372 and 374 is inserted between opposing edges 344 and 346 (actuating edges) of prong distal ends 340 and 342, respectively. As further shown in FIG. 5A, cam rods 372 and 374 are sufficiently thin so that when thusly inserted between opposing edges 344 and 346 of prong distal ends 340 and 342, respectively, prongs 330 and 332 can resiliently relax a sufficient amount to be able to hold chip 310. In accordance with one or more such embodiments of the present invention, prongs 330 and 332 may be moved apart by relative motion of cam rods 372 and 374 urging upon edges 344 and 346 of distal ends 340 and 342, respectively. In accordance with one or more such embodiments, relative motion of cam rods 372 and 374 may be achieved by rotating the cam or by moving cam rod 372 with respect to cam rod 374. FIG. 5B is a top view of site 300 in an open configuration in which cam rods 372 and 374 are moved (as indicated by arrows R and S, respectively) from their position as shown in FIG. 5A. As shown in FIG. 5B, faces of cam rods 372 and 374 urge outwardly against edges 344 and 346 of distal ends 340 and 342, respectively, thereby moving prongs 330 and 332 apart and away from chip 310 in aperture 322. In accordance with one or more such embodiments, in the open configuration, chip 310 is free to be removed from site 300.

FIG. 6A is a top view of site 400 of a carrier that is fabricated in accordance with one or more embodiments of the present invention wherein site 400 is shown in a closed configuration holding chip 410 in aperture 422. As shown in FIG. 6A, in accordance with one or more such embodiments of the present invention, distal ends 440 and 442 of prongs 430 and 432, respectively, have been fabricated to provide a chamber within which cam 476 may be inserted, wherein tips of distal ends 440 and 442 form a channel and the thickness of cam 476 exceeds the width of the channel when prongs 430 and 432 hold chip 422. As further shown in FIG. 6A, cam 476 is inserted between opposing edges 444 and 446 of distal ends 440 and 442 of prongs 430 and 432, respectively. In accordance with one or more embodiments of the present invention, prong ends 440 and 442 may be moved apart by linear motion of cam 476 (for example, in a direction shown by arrow T) into the channel. FIG. 6B is a top view of site 400 in an open configuration wherein cam 476 is moved in the direction of arrow T from its position as shown in FIG. 6A. As shown in FIG. 6B, cam 476 urges outwardly against edges of distal ends 440 and 442, respectively, thereby moving prongs 430 and 432 apart and away from chip 410 in aperture 422. Alternatively, prongs 430 and 432 may be moved apart by moving cam 476 in a direction opposite the direction of arrow T and toward chip 410, thereby releasing the chip. In accordance with one or more such embodiments, in the open configuration, chip 410 is free to be removed from site 400.

FIG. 7A is a top view of site 500 of a carrier that is fabricated in accordance with one or more embodiments of the present invention where site 500 is shown in a closed configuration holding chip 510 in aperture 522. As shown in FIG. 7A, in accordance with one or more such embodiments of the present invention, distal ends 540 and 542 of prongs 530 and 532, respectively, have been fabricated to provide a chamber within which cam 576 may be inserted. As further shown in FIG. 7A, distal ends 540 and 542 have been fabricated so that a distance between opposing edges 544 and 546 (actuating edges) of distal ends 540 and 542 varies along a portion of the edges so that: (a) at one position, the distance is large enough so that cam 576 may be inserted between opposing edges 544 and 546 of distal ends 544 and 546, respectively, while prongs 530 and 532 may hold chip 510; and (b) at another position, the distance is small enough so that cam 576 urges opposing edges 544 and 546 apart. As shown in FIG. 7A, cam 576 is inserted between opposing edges 544 and 546 of distal ends 544 and 546, respectively. In accordance with one or more embodiments of the present invention, prong ends 540 and 542 may be moved apart by linear motion of cam 576 (for example, in a direction shown by arrow V) between distal ends 540 and 542. As shown in FIGS. 7A and 7B, edges 544 and 546 are shaped so that site 500 is in: (a) a closed configuration when cam 576 is disposed in a first position along the edges; and (b) an open configuration when cam 576 is disposed in a second position along the edges. FIG. 7B is a top view of site 500 wherein cam 576 is moved in the direction of arrow V from its position as shown in FIG. 7A. As shown in FIG. 7B, cam 576 urges outwardly against edges 544 and 546, respectively, thereby moving prongs 530 and 532 apart and away from chip 510 in aperture 522. In accordance with one or more such embodiments, in the open configuration, chip 510 is free to be removed from site 500.

As one of ordinary skill in the art can readily appreciate, in accordance with one or more embodiments of the present invention, distal ends of the prongs may also be fabricated so that movement of a cam may be: (a) towards the aperture to enable a device to be placed therein or removed therefrom, and (b) away from the aperture to enable the prongs to flex so that the device can be held within the aperture. Results such as this can be achieved by fabricating the distal ends of the prongs to have various shapes that will be clear in light of the description herein, for example and without limitation, multiple chambers, or spacing that varies from narrow to larger as a rod moves away from the aperture.

Figure 10A:
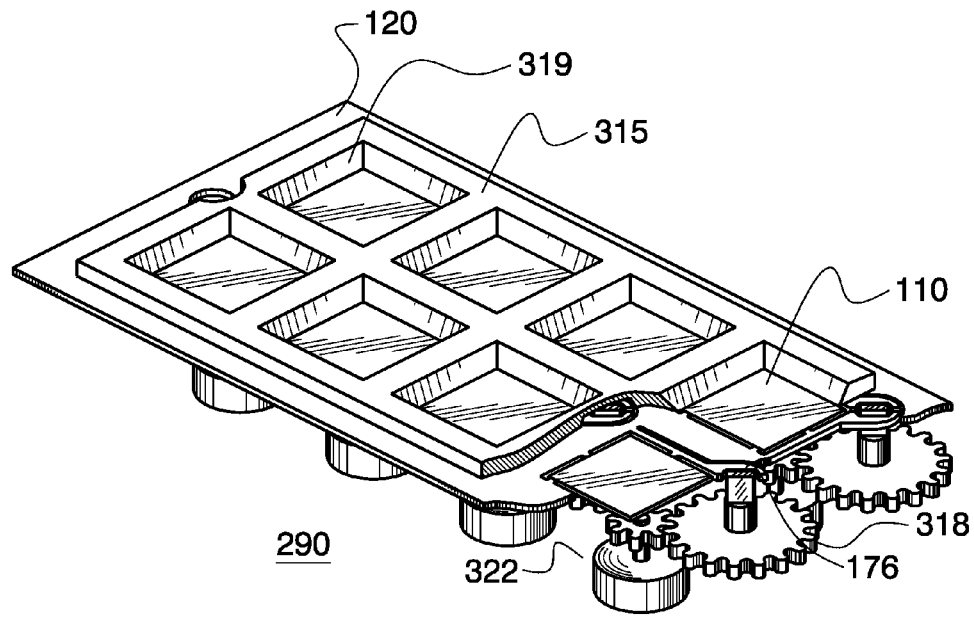
FIGS. 10A and 10B are cutaway perspective views of a carrier for holding microelectronic devices that is fabricated in accordance with one or more embodiments of the present invention, which figures show apparatus having movable cams disposed between actuating edges of two prongs at carrier sites where.
Figure 10B:
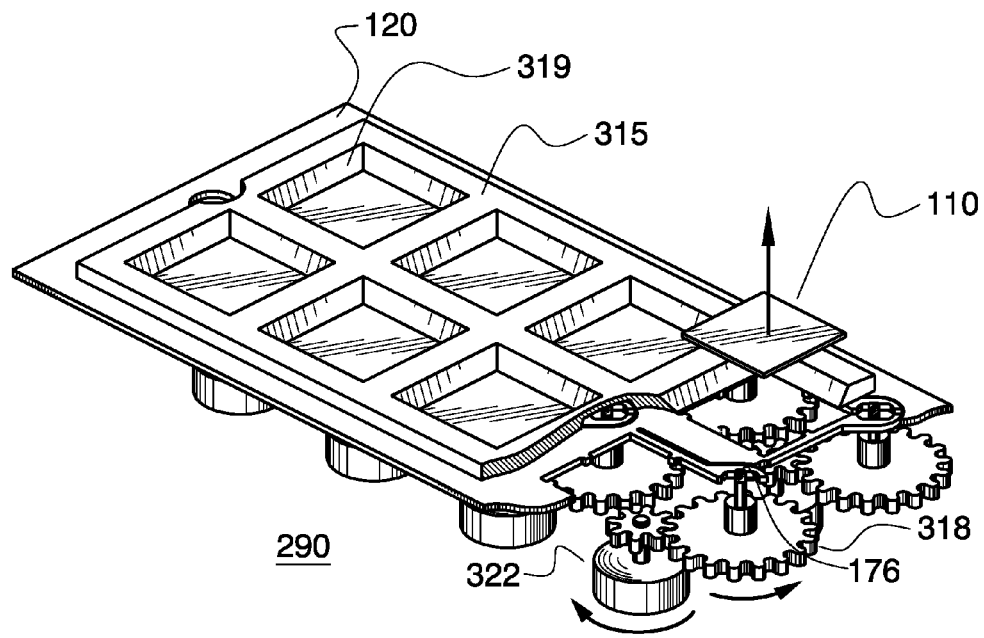

FIGS. 10A and 10B are cutaway perspective views of carrier 290 for holding microelectronic devices that is fabricated in accordance with one or more embodiments of the present invention, which figures show apparatus having movable cams 176 disposed between actuating edges of two prongs at carrier sites. As shown in FIG. 10A, movable cams 176 are disposed so that the carrier sites are in a closed configuration, and FIG. 10B shows cams 176 disposed after movement (for example and without limitation, by rotation) so that the carrier sites are in an open configuration. As shown in FIG. 10A, the apparatus comprises one or more rotational motors 322 for rotating cams 176 by means of gears 318. The apparatus is moved upwardly by a stepper motor drive (not shown) affixed to the apparatus for inserting the cams between, and for retracting the cams to be clear of, respectively, the actuating edges. In addition, in accordance with one or more further embodiments, the apparatus comprises a first stepper motor affixed to the cams for inserting the cams between, and for retracting the cams to be clear of, respectively, the actuating edges, and a second stepper motor for moving the cams along a direction while the cams are disposed between the actuating edges so that such movement causes a distance between the actuating edges to change. In further addition, in accordance with one or more further embodiments, the apparatus comprises a first stepper motor affixed to the cams for inserting the cam between, and for retracting the cams to be clear of, respectively, the actuating edges, and a second stepper motor for moving the cams, and more particularly, portions of the cams, in directions so that such movement causes a distance between the actuating edges to change.

Embodiments of the present invention described above are exemplary. As such, many changes and modifications may be made to the description set forth above by those of ordinary skill in the art while remaining within the scope of the invention. In addition, materials, methods, and mechanisms suitable for fabricating embodiments of the present invention have been described above by providing specific, non-limiting examples and/or by relying on the knowledge of one of ordinary skill in the art. Materials, methods, and mechanisms suitable for fabricating various embodiments or portions of various embodiments of the present invention described above have not been repeated, for sake of brevity, wherever it should be well understood by those of ordinary skill in the art that the various embodiments or portions of the various embodiments could be fabricated utilizing the same or similar previously described materials, methods or mechanisms. As such, the scope of the invention should be determined with reference to the appended claims along with their full scope of equivalents.

What is claimed is:

1. A carrier for releasably holding devices comprises:
   a body having one or more sites having a first portion adapted to hold a device and a second portion; and
   at least one of the one or more sites having a first resilient prong and a second resilient prong;
   wherein:
   the first resilient prong has: (a) an end affixed to the body in the first portion, (b) a first prong body disposed in the first portion, and (c) a distal end extending into the second portion;
   the second resilient prong has: (a) an end affixed to the body in the first portion, (b) a second prong body disposed in the first portion, and (c) a distal end extending into the second portion;
   (a) at least a portion of an edge of the distal end of the first prong (first distal edge) is juxtaposed to at least a portion of an edge of the distal end of the second prong (second distal edge), (b) at least a portion of an edge of the first prong body (first prong body edge) is disposed to enable it to resiliently hold the device against an edge of a first portion of a perimeter of the first portion (first perimeter portion), and (c) at least a portion of an edge of the second prong body (second prong body edge) is disposed to enable it to resiliently hold the device against an edge of a second portion of the perimeter of the first portion (second perimeter portion); and
   the first distal edge and the second distal edge are disposed so that movement thereof apart causes movement of the first prong edge away from the first perimeter portion and movement of the second prong edge away from the second perimeter portion.

2. The carrier of claim 1 wherein the second portion includes an aperture disposed through the body.

3. The carrier of claim 1 wherein the first portion includes an aperture disposed through the body.

4. The carrier of claim 3 wherein the site includes a beveled frame disposed about at least a portion of the aperture.

5. A carrier for releasably holding devices in a contact plane, the carrier comprising:
   a body having one or more sites each having a holding portion in which a device may be held; and
   at least one of the one or more sites having a first resilient prong and a second resilient prong;
   wherein:
   the first resilient prong has: (a) a proximal end affixed to the body, (b) a first contactor edge disposed in the contact plane, and (c) a movable distal end extending beyond the holding portion;
   the second resilient prong has: (a) a proximal end affixed to the body, (b) a second contactor edge disposed in the contact plane, and (c) a movable distal end extending beyond the holding portion;
   a contactor edge of a first portion of a perimeter of the holding portion (third contactor edge) and a contactor edge of a second portion of the perimeter (fourth contactor edge) are disposed in the contact plane;
   an actuation edge of the movable distal end of the first prong (first actuation edge) is juxtaposed to an actuation edge of the movable distal end of the second prong (second actuation edge);
   the first contactor edge is disposed to enable it to resiliently hold the device against the third contactor edge and the second contactor edge is disposed to enable it to resiliently hold the device against the fourth contactor edge; and
   the first actuation edge and the second actuation edge are disposed so that movement thereof apart causes movement of the first contactor edge away from the third contactor edge and movement of the second contactor edge away from the fourth contactor edge.

6. The carrier of claim 5 wherein the at least one of the one or more sites includes an aperture disposed through the body.

7. The carrier of claim 5 wherein the holding portion includes an aperture disposed through the body.

8. The carrier of claim 7 wherein the site includes a beveled frame disposed about at least a portion of the aperture.

9. The carrier of claim 7 wherein the site includes a bottom structure adapted to prevent the device from falling out of the aperture.

10. The carrier of claim 9 wherein the bottom structure includes tabs disposed about the aperture.

11. The carrier of claim 9 wherein the bottom structure comprises a sheet.

12. The carrier of claim 11 wherein the sheet includes embedded contactors.

13. The carrier of claim 5 wherein the body is planar.

14. The carrier of claim 5 wherein the prongs are planar.

15. The carrier of claim 5 wherein one or more of the first and second contactor edges include one or more bosses.

16. The carrier of claim 5 wherein one or more of the third and fourth contactor edges include one or more bosses.

17. The carrier of claim 5 wherein springs are affixed to the body and to the movable distal ends of the prongs.

18. The carrier of claim 17 wherein the springs are flat springs.

19. The carrier of claim 5 wherein the movable distal ends are connected by a spring.

20. The carrier of claim 5 which further comprises alignment features.

21. The carrier of claim 5 which further comprises a beveled frame attached to the body that includes an array of frames, each of which frames has apertures with sloping sides.

22. The carrier of claim 5 wherein the first and second actuation edges have a curvilinear shape.

23. The carrier of claim 5 wherein the first and second actuation edges are straight.

24. The carrier of claim 5 wherein the first and second actuation edges are disposed at an angle to form a separation that is smaller at a predetermined distance from the aperture than it is at another distance.

25. The carrier of claim 5 wherein the body is comprised of a metal.

26. The carrier of claim 5 wherein the body is coated with a dielectric.

27. The carrier of claim 5 wherein the body is comprised of a non-metal.

* * * * *